United States Patent [19]

Yasuda

[11] Patent Number: 5,459,425
[45] Date of Patent: Oct. 17, 1995

[54] SIGNAL PROCESSING CIRCUIT WITH VOLTAGE LIMITING FUNCTION

[75] Inventor: Yukio Yasuda, Itami, Japan

[73] Assignee: Mitsubishi Denki Kabushiki Kaisha, Tokyo, Japan

[21] Appl. No.: 172,168

[22] Filed: Dec. 23, 1993

[30] Foreign Application Priority Data

Dec. 25, 1992 [JP] Japan ................. 4-346965

[51] Int. Cl.[6] .................. H03L 5/00; H03K 3/00; H03K 17/60
[52] U.S. Cl. .................. 327/306; 327/309; 327/327; 327/108; 327/110; 327/484
[58] Field of Search ................. 307/264, 255, 307/540, 313, 494, 496, 257; 327/108, 110, 403, 405, 484, 306, 309, 318, 327

[56] References Cited

U.S. PATENT DOCUMENTS

| | | | |
|---|---|---|---|
| 3,300,631 | 1/1967 | Vallese | 307/313 |
| 3,337,748 | 8/1967 | Rusch et al. | 327/110 |
| 3,470,497 | 9/1969 | Kotter | 307/313 |
| 3,515,906 | 6/1970 | Geller | 307/255 |
| 3,588,539 | 6/1971 | Vicentini | 307/255 |
| 4,433,251 | 2/1984 | Banks et al. | 327/110 |

*Primary Examiner*—Timothy P. Callahan
*Assistant Examiner*—Trong Phan
*Attorney, Agent, or Firm*—Leydig, Voit & Mayer

[57] ABSTRACT

A signal processing circuit for limiting a signal voltage generated, for example, across a signal source coil 1 within a range between a predetermined upper limit and a predetermined lower limit, includes: a second transistor pair 5a and 5b and a second transistor pair 5c and 5d coupled across the signal source coil 1. The base voltages of the transistors 5b and 5d are maintained at respective predetermined voltages by means of the serial circuit consisting of the resistor 5q, transistor 5e and the constant voltage source 5g and the serial circuit consisting of the constant voltage source 5h, transistor 5f and the resistor 5r, respectively, which are coupled across the voltage source 100. Thus, the second transistor pair 5a and 5b are turned on when the voltage at the signal input terminal 8 exceeds the upper limit. The second transistor pair 5c and 5d are turned on when the voltage at the signal input terminal 8 falls below the lower limit.

2 Claims, 3 Drawing Sheets

SIGNAL PROCESSING CIRCUIT WITH VOLTAGE LIMITING FUNCTION

BACKGROUND OF THE INVENTION

This invention relates to signal processing circuits for limiting the voltage level of the signal induced, for example, across a signal source coil, within a range between an upper and lower limits.

FIG. 3 is a circuit diagram showing a conventional signal processing circuit provided with a voltage limiter circuit. The signal voltage generated across the signal source coil 1 by means of the electromagnetic induction is applied across a signal input terminal 8 and a reference input terminal 9 through a voltage limiter resistor 3. A signal processing circuit 6 implemented as an IC (integrated circuit) includes: a reference voltage generator circuit 2 for determining the voltage of the reference input terminal 9; a voltage limiter circuit 5 for limiting the signal voltage; a comparator 4 for comparing the signal with a predetermined reference level and outputting the result of comparison to a signal output terminal 10; and a Zener diode 7 coupled across a voltage source terminal 11 and a grounded terminal 12 for limiting the source voltage.

The voltage limiter circuit 5 consists of transistors 54 and 55 and resistors 51, 52 and 53 The reference voltage generator circuit 2 consists of an amplifier 2a and resistors 2b and 2c. The voltage source 100 coupled to the voltage source terminal 11 has a source impedance 100a.

Next, the operation of the voltage limiter circuit 5 for limiting the signal voltage is described. The voltage induced across the signal source coil 1 is applied across the signal input terminal 8 and the reference input terminal 9 through the voltage limiter resistor 3. When the voltage at the signal input terminal 8 relative to the voltage at the reference input terminal 9 exceeds a predetermined upper limit, the emitter-base voltage of the PNP transistor 55 is biased in the forward direction, and the PNP transistor 55 is turned on. As a result, the current flows from the signal input terminal 8 to the ground through the PNP transistor 55 and the grounded terminal 12, thereby limiting the voltage at the signal input terminal 8 below the predetermined upper limit.

When, on the other hand, the signal voltage falls below a predetermined lower limit, the emitter-base voltage of the NPN transistor 54 is biased in the forward direction, and the NPN transistor 54 is turned on. As a result, the current flows from the voltage source 100 to the signal input terminal 8 through the voltage source terminal 11 and the NPN transistor 54, and thereby maintains the voltage at the signal input terminal 8 above the predetermined lower limit.

The upper and lower limits of the signal voltage are determined by the resistances $R_1$, $R_2$ and $R_3$ of the resistors 51, 52 and 53. Namely, the base voltage of the PNP transistor 55 is determined by the voltage $V_D$ at the point D between the resistors 51 and 52, which is given by:

$$V_D = V_{cc} \cdot (R_2 + R_3)/(R_1 + R_2 + R_3)$$

where $V_{CC}$ is the source voltage at the voltage source terminal 11. Thus, if the voltage at the signal input terminal 8 exceeds $V_D + V_f$, where $V_f$ is the forward voltage across the emitter band the base of the PNP transistor 55, the PNP transistor 55 is turned on and thereby limits the signal voltage below the upper limit $V_D + V_f$.

On the other hand, the base voltage of the NPN transistor 54 is determined by the voltage $V_E$ at the point E between the resistors 52 and 53, which is given by:

$$V_E = V_{cc} \cdot R_3/(R_1 + R_2 + R_3)$$

where $V_{cc}$ is the source voltage at the voltage source terminal 11. Thus, if the voltage at the signal input terminal 8 falls below $V_E - V_f$, where $V_f$ is the forward voltage across the base and emitter of the NPN transistor 54, the NPN transistor 54 is turned on and thereby maintains the signal voltage above the lower limit $V_E - V_f$.

The above conventional signal processing circuit, however, has the following disadvantage. When the signal voltage falls below the lower limit, the current is supplied from the voltage source 100 through the source impedance 100a and the NPN transistor 54, and the voltage at the signal input terminal 8 is maintained above the lower limit $V_E - V_f$. Thus, especially in the case where the value of the source impedance 100a is large, the source voltage at the voltage source terminal 11 varies greatly due to the operation of the voltage limiter circuit 5.

Further, assume that the resistance value of the source impedance 100a is not negligible compared with the resistance values of the resistors 2b and 2c. Then, when the current flows through the source impedance 100a due to the operation of the voltage limiter circuit 5, the voltage at the positive terminal of the amplifier 2a varies. As a result, the reference voltage provided by the reference voltage generator circuit 2 also varies. Furthermore, when the response speed of the reference voltage generator circuit 2 is slow, the operation thereof cannot follow that of the voltage limiter circuit 5. This may also cause a variation of the reference voltage provided by the reference voltage generator circuit 2.

SUMMARY OF THE INVENTION

It is therefore an object of this invention to provide a signal processing circuit with a voltage limiting function, by which the source voltage and the reference voltage levels are not affected by the operation of the voltage limiter circuit and are thus maintained at constant levels even when the voltage source has a large source impedance.

The above object is accomplished in accordance with the principle of this invention by a signal processing circuit which comprises: a first transistor coupled across the first and second terminals, having a forward direction allowing a current to flow from the first to the second terminal when turned on; a second transistor coupled across the first and second terminals, having a forward direction allowing a current to flow from the second to the first terminal when turned on; first means for turning on the first transistor when a voltage at the first terminal with respect to a voltage at the second terminal exceeds the predetermined upper limit; and second means for turning on the second transistor when a voltage at the first terminal with respect to a voltage at the second terminal falls below the predetermined lower limit.

Preferably, the first means comprises: first reference voltage providing means for providing a first reference voltage; and switching means for turning on the first transistor when a voltage at the first terminal relative to the first reference voltage rises above a first predetermined level; and the second means comprises: second reference voltage providing means for providing a second reference voltage; and switching means for turning on the second transistor when a voltage at the second terminal relative to the second reference voltage falls below a second predetermined level. Still preferably, the first reference voltage providing means comprises: a voltage source; and a serial circuit consisting of a resistor, a transistor and a constant voltage source coupled across the voltage source; a junction point between the transistor and the constant voltage source providing the first reference voltage; and the second second reference voltage providing means comprises: the voltage source; and a serial circuit consisting of a constant voltage source, a transistor and a resistor coupled across the voltage source; a junction point between the constant voltage source and the transistor providing the second reference voltage.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
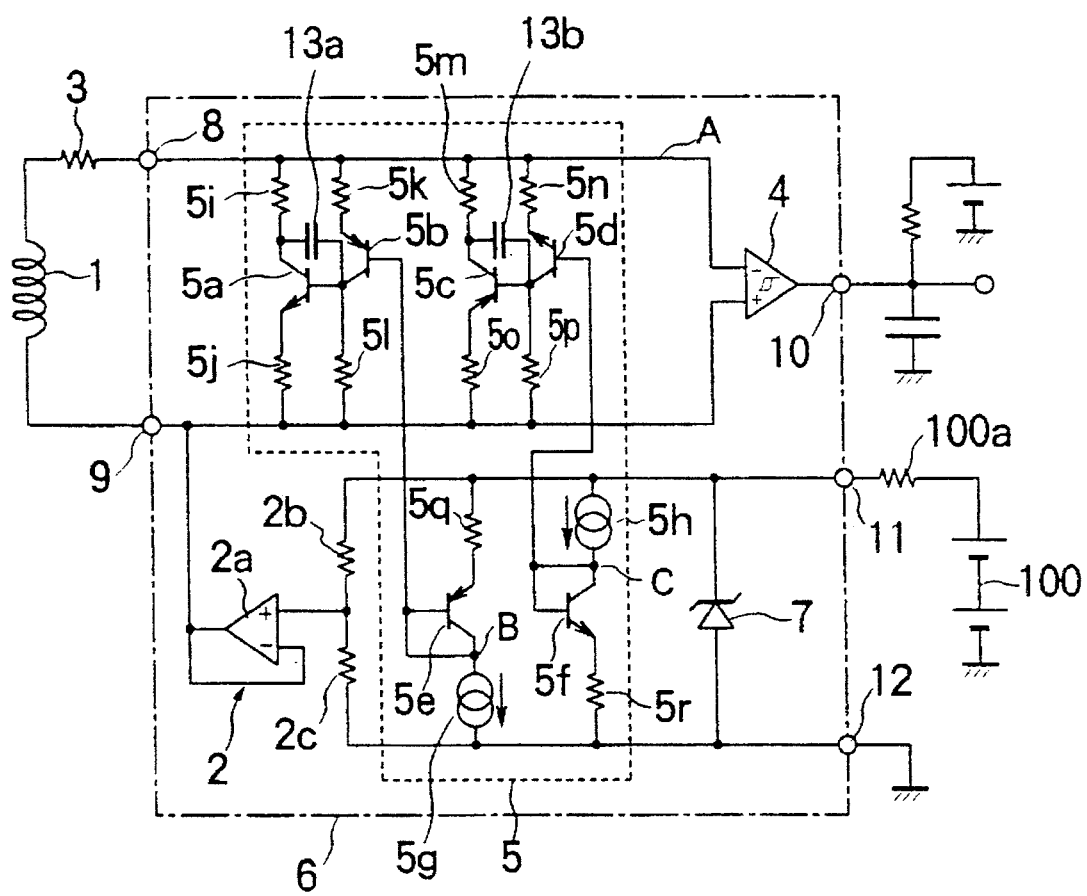
FIG. 1 is a circuit diagram showing a signal processing circuit provided with a voltage limiter circuit according to this invention.

FIG. 1 is a circuit diagram showing a signal processing circuit provided with a voltage limiter circuit according to this invention. The positive terminal ok the signal source coil 1 is coupled through a voltage limiter resistor 3 to a signal input terminal 8 of the signal processing circuit 6. The other terminal of the signal source coil 1 is coupled to a reference input terminal 9 of the signal processing circuit 6. The signal processing circuit 6, consisting of a voltage limiter circuit 5, a comparator 4, a reference voltage generator circuit 2, and a Zener diode 7, receives the input signal from the signal input terminal 8 and the reference input terminal 9 and outputs the output signal at the signal output terminal 10. The source voltage of the signal processing circuit 6 is supplied through a voltage source terminal 11 from a voltage source 100 having a source impedance 100a. The signal processing circuit 6 is grounded through a grounded terminal 12.

The voltage limiter circuit 5 consists of a first circuit portion for limiting the signal voltage below the upper limit, and a second circuit portion for maintaining the signal voltage above the lower limit. The first circuit portion for limiting the signal voltage below the upper limit consists of: an NPN transistor 5a, a PNP transistor 5b, and an PNP transistor 5e; resistors 5i, 5j, 5k, 51, and 5q coupled in series with the transistors 5a, 5b or the transistor 5e; a constant voltage source 5g; and a phase compensation capacitor 13a. The second circuit portion for maintaining the signal voltage above the lower limit consists of: a PNP transistor 5c, an NPN transistor 5d, and a NPN transistor 5f; resistors 5m, 5n, 5o, 5p, and 5r coupled in series with the transistors 5c, 5d or the transistor 5f; a constant voltage source 5h; and a phase compensation capacitor 13b.

The details of the connection of the first circuit portion of the voltage limiter circuit 5 for limiting the signal voltage below the upper limit is as follows. The resistor 5i is coupled to the collector of the NPN transistor 5a and the resistor 5j is coupled to the emitter of the NPN transistor 5a. The serial circuit thus formed of the resistor 5i, the NPN transistor 5a, and the resistor 5j is coupled across the signal input terminal 8 and the reference input terminal 9. The resistor 5k is coupled to the emitter of the PNP transistor 5b and the resistor 51 is coupled to the collector of the PNP transistor 5b. The serial circuit thus formed of the resistor 5k, the PNP transistor 5b, and the resistor 51 is coupled across the signal input terminal 8 and the reference input terminal 9.

The phase compensation capacitor 13a is coupled across the collector and the base of the NPN transistor 5a. The resistor 5q is coupled to the emitter of the PNP transistor 5e and the constant voltage source 5g is coupled to the collector of the PNP transistor 5e. The serial circuit thus formed of the resistor 5q, the PNP transistor 5e, and the constant voltage source 5g is coupled across the voltage source terminal 11 and the grounded terminal 12. The base of the PNP transistor 5b is coupled to the base and the collector of the PNP transistor 5e.

The details of the connection of the second circuit portion of the voltage limiter circuit 5 for maintaining the signal voltage above the lower limit is as follows. The resistor 5m is coupled to the collector of the PNP transistor 5c and the resistor 5o is coupled to the emitter of the PNP transistor 5c. The serial circuit thus formed of the resistor 5m, the PNP transistor 5c, and the resistor 5o is coupled across the signal input terminal 8 and the reference input terminal 9. The resistor 5n is coupled to the emitter of the NPN transistor 5d and the resistor 5p is coupled to the collector of the NPN transistor 5d. The serial circuit thus formed of the resistor 5n, the NPN transistor 5d, and the resistor 5p is coupled across the signal input terminal 8 and the reference input terminal 9.

The phase compensation capacitor 13b is coupled across the collector and the base of the PNP transistor 5c. The resistor 5r is coupled to the emitter of the NPN transistor 5f and the constant voltage source 5h is coupled to the collector of the NPN transistor 5f. The serial circuit thus formed of the constant voltage source 5h, the NPN transistor 5f, and the resistor 5r is coupled across the voltage source terminal 11 and the grounded terminal 12. The base of the NPN transistor 5d is coupled to the base and the collector of the NPN transistor 5f.

The reference voltage generator circuit 2 consists of: the resistors 2b and 2c coupled serially across the voltage source terminal 11 and the grounded terminal 12; and the amplifier 2a having the positive input terminal coupled to the junction point between the resistors 2b and 2c. The output terminal of the amplifier 2a is coupled to the reference input terminal 9 to provide the reference voltage. The Zener diode 7 is coupled across the voltage source terminal 11 and the grounded terminal 12. The input terminals of the comparator 4 is coupled to the signal input terminal 8 and the reference input terminal 9, respectively, the output terminal of the comparator 4 being coupled to the signal output terminal 10.

The operation of the signal processing circuit 6 is as follows. The signal voltage generated across the signal source coil 1 is applied through the voltage limiter resistor 3 across the signal input terminal 8 and the reference input terminal 9. The voltage at the reference input terminal 9 is maintained at the reference voltage by means of the reference voltage generator circuit 2. In what follows, the polarity of the signal voltage is defined as positive when the voltage at the signal input terminal 8 is greater than the voltage at the reference input terminal 9. The signal voltage is negative when the voltage at the signal input terminal 8 is smaller than the voltage at the reference input terminal 9. The signal voltage is said to to decrease when it varies in the negative direction, even when the absolute value thereof increases.

The voltage limiter circuit 5 limits the voltage across the signal input terminal 8 and the reference input terminal 9 between the upper and the lower limit. Namely, when the signal voltage generated across the signal source coil 1 rises above the upper limit or falls below the lower limit, the voltage limiter circuit 5 operates to maintain the voltage at the signal input terminal 8 relative to the voltage at the reference input terminal 9 within the range between the upper and the lower limits. The operation of the voltage limiter circuit 5 is described in detail below.

The comparator 4, which may exhibit a hysteresis characteristic, compares the voltage at the signal input terminal 8 with that at the reference input terminal 9, and outputs the result of comparison to the signal output terminal 10.

Next the operation of the voltage limiter circuit 5 is described in detail. As described above, the resistor 5q, the PNP transistor 5e and the constant voltage source 5g are coupled serially across the voltage source terminal 11 and the grounded terminal 12, the base and the collector of the PNP transistor 5e being coupled to each other. Thus the PNP transistor 5e is always turned on, such that a biasing current flows through the serial circuit consisting of the resistor 5q, the PNP transistor 5e, and the constant voltage source 5g.

Thus, the voltage $V_B$ (V) at the collector terminal of the PNP transistor 5e is given by:

$$V_B = V_{cc} - I_1 \cdot R_1 - V_f$$

Where $V_{cc}$ (V) is the source voltage at the voltage source terminal 11, $I_1$ (A) is the current flowing through the constant voltage source 5g, $V_f$ (V) is the forward voltage drop of the PNP transistor 5e, $R_1$ ($\Omega$) is the resistance of the resistor 5q. The base of the PNP transistor 5b is coupled to the point B, and hence the voltage thereat is equal to $V_B$ (V).

Similarly, the constant voltage source 5h, the NPN transistor 5f and the resistor 5r are coupled serially across the voltage source terminal 11 and the grounded terminal 12, the base and the collector of the NPN transistor 5f being coupled to each other. The NPN transistor 5f is thus kept turned on, such that a biasing current flows through the serial circuit consisting of the constant voltage source 5h, the NPN transistor 5f and the resistor 5r. Thus, the voltage $V_c$ (V) at the collector terminal of the NPN transistor 5f is given by:

$$V_c = I_2 \cdot R_2 + V_f$$

where $I_2$ (A) is the current flowing through the constant voltage source 5h, $V_f$ (V) is the forward voltage drop of the NPN transistor 5f, $R_2$ ($\Omega$) is the resistance of the resistor R$r$. The base of the NPN transistor 5d is coupled to the point C, and hence the voltage thereat is equal to $V_c$ (V).

Next, the operation of the voltage limiter circuit 5 in the case where the signal voltage varies within the predetermined range is described.

As described above, the base voltages of the PNP transistor 5b and the NPN transistor 5d are maintained at respective predetermined levels $V_B$ and $V_c$. On the other hand, the emitters of the PNP transistor 5b and the NPN transistor 5d are coupled to the signal input terminal 8, whose voltage is assumed at present to vary between the predetermined upper and lower limits. The PNP transistor 5b and the NPN transistor 5d are thus kept turned off. As a result, the NPN transistor 5a and the PNP transistor 5c are kept turned off. The current flowing into or out of the voltage limiter circuit 5 is negligible. The signal voltage applied across the signal input terminal 8 and the reference input terminal 9 is thus input to the comparator 4 without modification. Further, since the input impedance of the comparator 4 is great, the current flowing into or out of the comparator 4 is also negligible. The voltage across the signal input terminal 8 and the reference input terminal 9 is thus equal to the signal voltage generated across the signal source coil 1.

Next, the operation of the voltage limiter circuit 5 is described in the case where the signal voltage increases above the upper limit and the voltage limiter circuit 5 operates to limit it below the upper limit.

As described above, the base voltage of the PNP transistor 5b is kept at $V_B$. When the voltage at the signal input terminal 8 increases in the positive direction and exceeds the upper limit, the emitter and the base of the PNP transistor 5b is biased in the forward direction, and the PNP transistor 5b is turned on. Namely, when the voltage $V_{AB}$ at the point A coupled to the signal input terminal 8 relative to the point B coupled to the base of the PNP transistor 5b exceeds the forward biasing voltage across the emitter and the base of the PNP transistor 5b, the PNP transistor 5b is turned on. As a result the current flows through the resistor 5k, the PNP transistor 5b and the resistor 5l which are coupled serially across the signal input terminal 8 and the reference input terminal 9. The current flowing through the resistor 5k, the PNP transistor 5b and the resistor 5l increases as the voltage at the signal input terminal 8 increases. As a result, the base voltage of the NPN transistor 5a rises, and the base and the emitter of the NPN transistor 5a are biased in the forward direction. The NPN transistor 5a is thus turned on, such that the current flows through the resistor 5i, the NPN transistor 5a and the resistor 5j which are coupled serially across the signal input terminal 8 and the reference input terminal 9. The current flowing through the NPN transistor 5a increases as the voltage at the signal input terminal 8 increases.

Due to the negative feedback operation of the PNP transistor 5b and the NPN transistor 5a as described above, the voltage across the signal input terminal 8 and the reference input terminal 9 is kept under the upper limit $V_x$. The upper limit $V_x$ is determined by the voltage $V_B$ at the point B, the parameters of the NPN transistor 5a and the PNP transistor 5b, and the resistances of the resistors 5i, 5j, 5k and 5l. By the way, the phase compensation capacitor 13a compensates for the phase shift of the signal voltage which takes place when the NPN transistor 5a turns on.

Next, the operation of the voltage limiter circuit 5 is described in the case where the signal voltage decreases and the voltage limiter circuit 5 maintains it above the upper limit.

As described above, the base voltage of the NPN transistor 5d is kept at $V_c$. When the voltage at the signal input terminal 8 decreases and falls below the lower limit, the emitter and the base of the NPN transistor 5d is biased in the forward direction, and the NPN transistor 5d is turned on. Namely, when the voltage $V_{Ac}$ across the point A coupled to the signal input terminal 8 and the point C coupled to the base of the NPN transistor 5d exceeds the forward biasing voltage across the emitter and the base of the NPN transistor 5d, the NPN transistor 5d is turned on. As a result the current flows through the resistor 5n, the NPN transistor 5d and the resistor 5p which are coupled serially across the signal input terminal 8 and the reference input terminal 9. The current flowing through the resistor 5n, the NPN transistor 5d and the resistor 5p increases as the voltage at the signal input terminal 8 decreases. As a result, the base voltage of the PNP transistor 5c decreases, and the base and the emitter of the PNP transistor 5c are biased in the forward direction. The PNP transistor 5c is thus turned on, such that the current flows through the resistor 5o, the PNP transistor 5c and the resistor 5m which are coupled serially across the signal input terminal 8 and the reference input terminal 9. The current flowing through the PNP transistor 5c increases as the voltage at the signal input terminal 8 increases.

Due to the negative feedback operation of the NPN transistor 5d and the PNP transistor 5c as described above, the voltage across the signal input terminal 8 and the reference input terminal 9 is kept above the lower limit $V_Y$. The lower limit $V_Y$ is determined by the voltage $V_c$ at the point C, the parameters of the PNP transistor 5c and the NPN transistor 5d, and the resistances of the resistors 5m, 5o, 5n and 5p. By the way, the phase compensation capacitor 13b compensates for the phase shift of the signal voltage which takes place when the PNP transistor 5c turns on.

Figure 2:
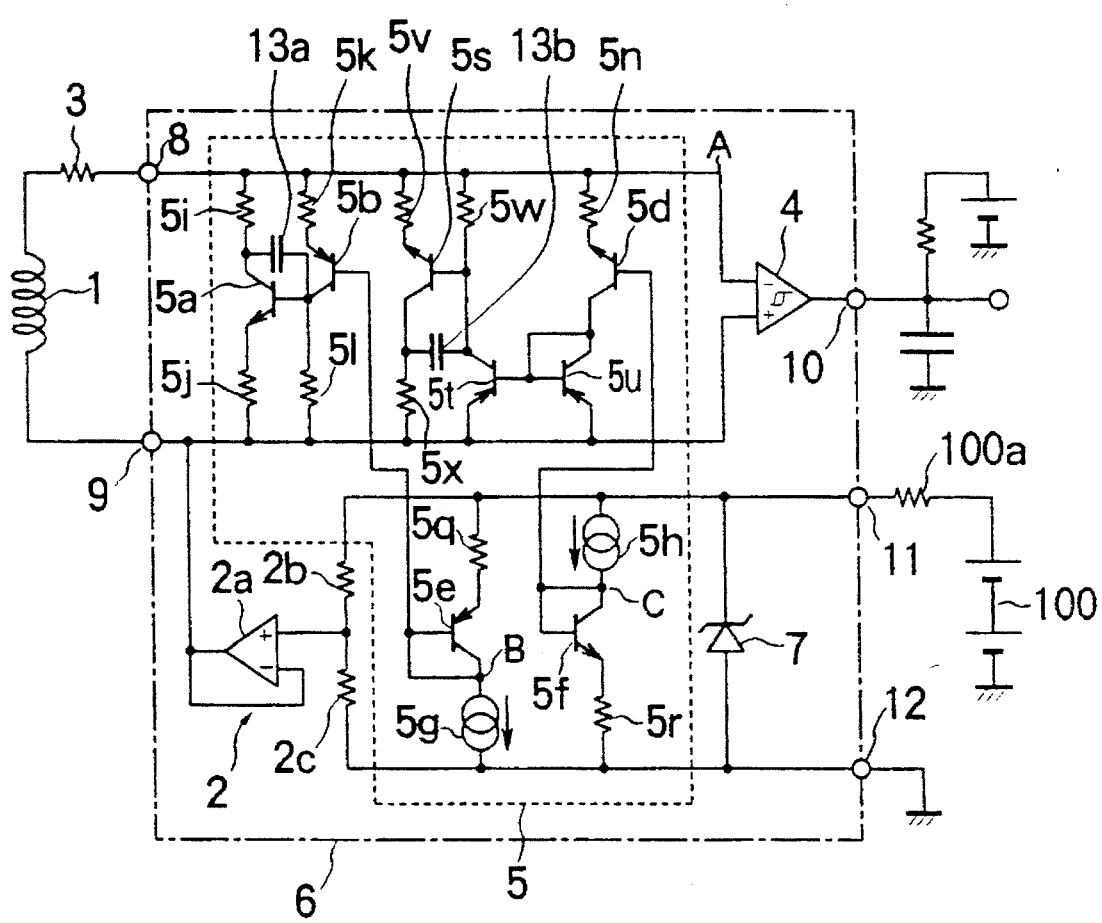
FIG. 2 is a circuit diagram showing another signal processing circuit provided with a voltage limiter circuit according to this invention.
Figure 3:
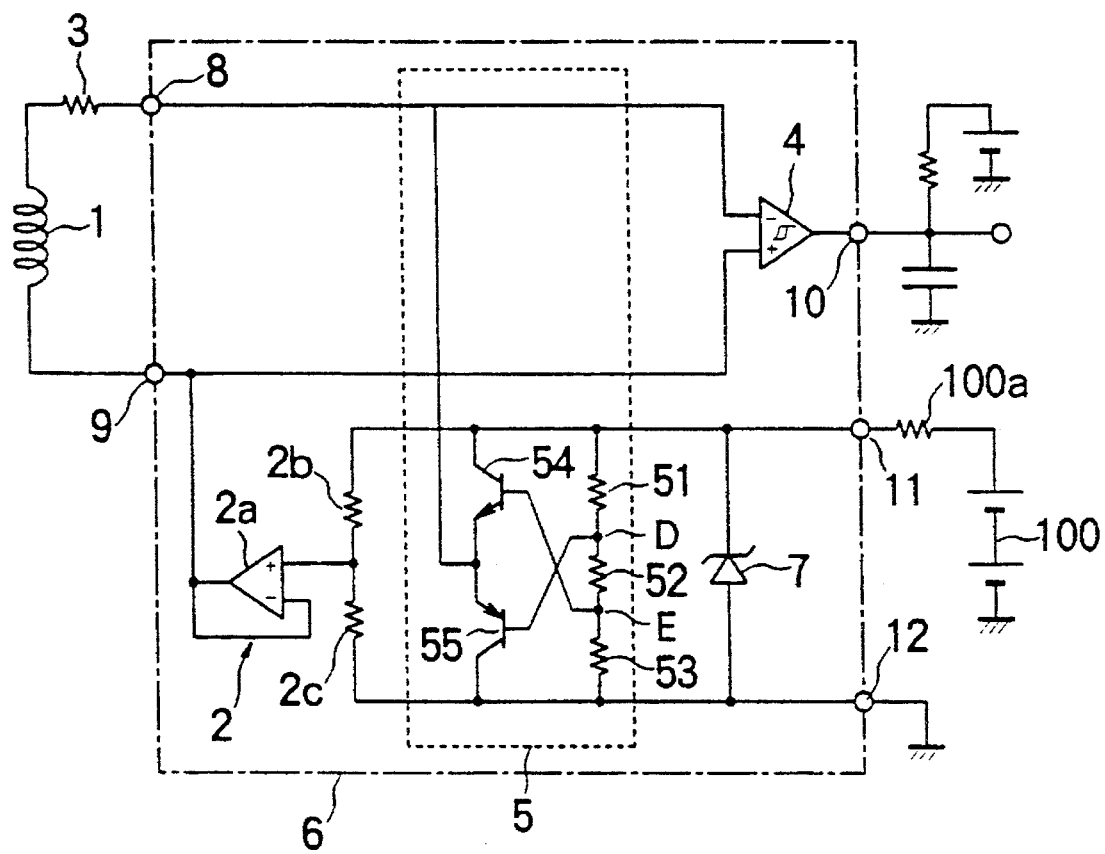
FIG. 3 is a circuit diagram showing a conventional signal processing circuit provided with a voltage limiter circuit.

In the case of the above embodiment of FIG. 1, the PNP transistor 5c is used to keep the signal voltage above the lower limit. However, the PNP transistor exhibits a lower current amplification factor and a smaller level of permissible current than a NPN transistor of the same size. Thus, integration of the PNP transistor upon an IC chip requires a larger space. FIG. 2 shows an embodiment by which a NPN transistor is used for maintaining the signal voltage above the lower limit. The embodiment of FIG. 2 is thus better adapted to a higher degree of circuit integration.

In FIG. 2, the portion of the voltage limiter circuit 5 for limiting the signal voltage below the upper limit is similar to that of FIG. 1. On the other hand, the portion of the voltage limiter circuit 5 for maintaining the signal voltage above the lower limit includes a NPN transistor 5s, a PNP transistor 5t, a PNP transistor 5u and resistors 5v, 5w and 5x, instead of the PNP transistor 5c and the resistors 5m, 5o and 5p of FIG. 1.

Namely, the emitter of the NPN transistor 5s is coupled to the resistor 5v, and the collector of the NPN transistor 5s is coupled to the resistor 5x. The serial circuit thus formed of the resistor 5v, the NPN transistor 5s and the resistor 5x is coupled across the signal input terminal 8 and the reference input terminal 9. The resistor 5w is coupled across the base of the NPN transistor 5s and the signal input terminal 8. Further the base of the NPN transistor 5s is coupled to the collector of the PNP transistor 5t and the serial circuit consisting of the resistor 5w and the FNP transistor 5t is coupled across the signal input terminal 8 and the reference input terminal 9. Further, the collectors of the NPN transistor 5d and the PNP transistor 5u are coupled to each other and the serial circuit consisting of the resistor 5n, the NPN transistor 5d and the PNP transistor 5u is coupled across the signal input terminal 8 and the reference input terminal 9. The bases of the PNP transistors 5t and 5u, which are coupled to each other, are coupled to the collector of the PNP transistor 5u. Furthermore, the phase compensation capacitor 13b is coupled across the collector and the base of the NPN transistor 5s. The constant voltage source 5h, the NPN transistor 5f and the resistor 5r are coupled to each other as in the case of the embodiment of FIG. 1, the point C being coupled to the base of the NPN transistor 5d.

The operation of the circuit of FIG. 2 is similar to that of FIG. 1, except that the circuit operates as follows when the voltage at the signal input terminal 8 falls below the lower limit.

When the signal voltage decreases and the voltage at the point A falls below the lower limit and the voltage $V_{Ac}$ across the points A and C (i.e., the voltage at point C relative to the voltage at point A) exceeds the forward biasing voltage across the base and the emitter of the NPN transistor 5d, the NPN transistor 5d is turned on. As a result, the PNP transistors 5u and 5t are turned on. Thus, the current flows from the reference input terminal 9 to the signal input terminal 8 through the PNP transistor 5t, the resistor 5w, the PNP transistor 5u, the NPN transistor 5d and the resistor 5n. As a result the NPN transistor 5s is turned on, and the current flows from the reference input terminal 9 to the signal input terminal 8 through the resistor 5x, the NPN transistor 5s, and the resistor 5v. The voltage at the signal input terminal 8 is thus maintained above the lower limit.

What is claimed is:

1. A signal processing circuit comprising:

first and second terminals;

a first transistor coupled across the first and second terminals and having a forward direction allowing a current to flow from the first terminal to the second terminal when the first transistor is turned on;

a second transistor coupled across the first and second terminals and having a forward direction allowing a current to flow from the second terminal to the first terminal when the second transistor is turned on;

a control circuit means for turning on the first transistor when a differential voltage across the first and second terminals exceeds an upper limit and turning on the second transistor when the differential voltage falls below a lower limit, wherein the control circuit means includes first and second reference voltage sources, the upper and lower limits are respectively determined by the first and second reference voltage sources, and the first and second reference voltage sources respectively generate first and second reference voltages wherein the first reference voltage source includes a first serial circuit including a first resistor, a third transistor and a first constant voltage source, a junction point between the third transistor and the first constant voltage source generating the first reference voltage, and wherein the second reference voltage source includes a second serial circuit including a second constant voltage source, a fourth transistor and a second resistor, a junction point between the second constant voltage source and the fourth transistor generating the second reference voltage.

2. A signal processing circuit for limiting a voltage across a coil, the signal processing circuit comprising:

first and second terminals receiving a differential voltage;

a first transistor coupled across the first and second terminals and having a forward direction allowing a current to flow from the first terminal to the second terminal when the first transistor is turned on;

a second transistor coupled across the first and second terminals and having a forward direction allowing a current to flow from the second terminal to the first terminal when the second transistor is turned on;

first and second reference voltage sources;

a control circuit means for turning on the first transistor when the differential voltage across the first and second terminals exceeds an upper limit as determined responsive to the first reference voltage source and for turning on the second transistor when the differential voltage falls below a lower limit as determined responsive to the second reference voltage source wherein said first reference voltage source includes a first serial circuit means including a first resistor, a third transistor and a first constant voltage source, a junction point between the third transistor and the first constant voltage source generating a first reference voltage, and wherein said second reference voltage source includes a second serial circuit means including a second constant voltage source, a fourth transistor and a second resistor, a junction point between the second constant voltage source and the fourth transistor generating a second reference voltage.

* * * * *